(12) United States Patent
Li et al.

(10) Patent No.: US 6,790,788 B2
(45) Date of Patent: Sep. 14, 2004

(54) METHOD OF IMPROVING STABILITY IN LOW K BARRIER LAYERS

(75) Inventors: Lihua Li, San Jose, CA (US); Tzu-Fang Huang, San Jose, CA (US); Li-Qun Xia, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/342,079

(22) Filed: Jan. 13, 2003

(65) Prior Publication Data

US 2004/0137756 A1 Jul. 15, 2004

(51) Int. Cl.[7] .............................................. H01L 21/31
(52) U.S. Cl. ...................... 438/778; 438/789; 438/702; 438/689; 438/637; 216/13; 216/72
(58) Field of Search ................. 438/627, 643, 438/653, 637, 689, 700, 702, 778, 789

(56) References Cited

U.S. PATENT DOCUMENTS

| | | | |
|---|---|---|---|
| 3,510,369 A | 5/1970 | Ernick et al. | 148/187 |
| 4,872,947 A | 10/1989 | Wang et al. | 156/643 |
| 4,895,734 A | 1/1990 | Yoshida et al. | 427/38 |
| 4,951,601 A | 8/1990 | Maydan et al. | 118/719 |
| 5,011,706 A | 4/1991 | Tarhay et al. | 427/39 |
| 5,086,014 A | 2/1992 | Miyata et al. | |
| 5,242,530 A | 9/1993 | Batey et al. | 156/613 |
| 5,298,597 A | 3/1994 | You et al. | 528/336 |
| 5,360,491 A | 11/1994 | Carey et al. | 136/256 |
| 5,465,680 A | 11/1995 | Loboda | 117/84 |
| 5,468,978 A | 11/1995 | Dowben | 257/258 |
| 5,480,300 A | 1/1996 | Okoshi et al. | 432/241 |
| 6,054,379 A | 4/2000 | Yau et al. | 438/623 |
| 6,147,009 A | 11/2000 | Grill et al. | 438/780 |
| 2002/0111042 A1 | 8/2002 | Yau et al. | 438/789 |
| 2003/0003765 A1 | 1/2003 | Gibson, Jr. et al. | 438/760 |
| 2003/0003768 A1 * | 1/2003 | Cho et al. | 438/778 |
| 2003/0089988 A1 | 5/2003 | Matsuura | 257/758 |
| 2003/0111730 A1 | 6/2003 | Takeda et al. | 257/758 |
| 2003/0129827 A1 | 7/2003 | Lee et al. | 438/629 |

FOREIGN PATENT DOCUMENTS

| | | | | |
|---|---|---|---|---|
| EP | 1 107 303 | 6/2001 | | H01L/21/316 |
| JP | 09 320 075 A | 12/1997 | | G11B/7/09 |
| WO | 99/41423 | 8/1999 | | |

OTHER PUBLICATIONS

PCT International Search Report for US/02/36229 dated Sep. 3, 2003 (AMAT/6392.PC).

Ogawa et al., "Novel ARC Optimization Methodology for KrF Excimer Laser Lithography at Low K1 Factor", *Proceedings of the SPIE. Optical/Laser Microlithography V*, vol. 1674, 1992, pp. 362–375.

Dijkstra et al., "Optimization of Anti–Reflection Layers for Deep UV Lithography", *Proceedings of SPIE Optical/Laser Microlithography, Bellingham, SPIE*, vol. 1927, 1993, pp. 275–286.

Omar, M.A., "Elementary Solid State Physics: Principles and Applications," Lowell Technological Institute, Addison–Wesley Publishing Company, ® 1975, pp.:124, 125.

PCT International Search Report dated Feb. 11, 2000 for US99/22425. (2966.01 PC).

PCT International Search Report for US02/40034 dated May 19, 2003. (AMAT/6084.PC).

Wu, et al. "Advanced Metal Barrier Free Cu Damascene Interconnects with PECVD Silicon Carbide Barriers for 90/65–nm BEOL Technology", 2002 IEEE, IEDM pp. 595–598.

* cited by examiner

*Primary Examiner*—D Le
(74) *Attorney, Agent, or Firm*—Moser, Patterson & Sheridan

(57) ABSTRACT

A method is provided for processing a substrate including providing a processing gas comprising hydrogen gas and an organosilicon compound comprising a phenyl group to the processing chamber, and reacting the processing gas to deposit a low k silicon carbide barrier layer useful as a barrier layer in damascene or dual damascene applications with low k dielectric materials.

26 Claims, 5 Drawing Sheets

METHOD OF IMPROVING STABILITY IN LOW K BARRIER LAYERS

CROSS-REFERENCE TO RELATED APPLICATIONS

This application is related to U.S. patent application Ser. No. 10/010,950, filed Nov. 13, 2001, and U.S. patent application Ser. No. 10/122,106, filed Apr. 11, 2002, which are herein incorporated by reference to the extent not inconsistent with the disclosure and claims herein. This application is further related to U.S. patent application Ser. No. 10/247,404, filed Sep. 19, 2002.

BACKGROUND OF THE DISCLOSURE

1. Field of the Invention

The invention relates to the fabrication of integrated circuits, more specifically to a process for depositing dielectric layers on a substrate, and to the structures formed by the dielectric layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to also reduce the capacitive coupling between adjacent metal lines. One such low k material is silicon oxycarbide deposited by a chemical vapor deposition process and silicon carbide, both of which may be used as dielectric materials in fabricating damascene features.

One conductive material having a low resistivity is copper and its alloys, which have become the materials of choice for sub-quarter-micron interconnect technology because copper has a lower resistivity than aluminum, (1.7 $\mu\Omega$-cm for copper compared to 3.1 $\mu\Omega$-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, e.g., vias, and horizontal interconnects, e.g., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

However, low k dielectric materials are often porous and susceptible to interlayer diffusion of conductive materials, such as copper, which can result in the formation of short-circuits and device failure. A dielectric barrier layer material is often disposed between the copper material and surrounding the low k material to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Therefore, there remains a need for an improved process for depositing dielectric barrier layer materials with low dielectric constants for damascene applications.

SUMMARY OF THE INVENTION

Aspects of the invention generally provide a method for depositing a barrier layer material having a low dielectric constant. In one aspect, the invention provides a method for processing a substrate including depositing a barrier layer on the substrate by introducing a processing gas comprising hydrogen and an oxygen-free organosilicon compound into a processing chamber, wherein the oxygen-free organosilicon compound has the formula $SiH_a(CH_3)_b(C_6H_5)_c$, wherein a is 0 to 3, b is 0 to 3, and c is 1 to 4, and reacting the processing gas to deposit the barrier layer, wherein the barrier layer has a dielectric constant less than 4 and depositing a first dielectric layer adjacent the barrier layer, wherein the dielectric layer comprises silicon, oxygen, and carbon and has a dielectric constant of about 3 or less.

In another aspect, a method is provided for processing a substrate including depositing a barrier layer on the substrate by introducing a processing gas comprising hydrogen and an oxygen-free organosilicon compound into a processing chamber, wherein the oxygen-free organosilicon compound has the formula $SiH_a(CH_3)_b(C_6H_5)_c$, wherein a is 1 or 2, b is 1 or 2, and c is 1 or 2, and reacting the processing gas to deposit the barrier layer, wherein the barrier layer has a dielectric constant of less than 4, treating the deposited barrier layer to an e-beam curing technique, and depositing a dielectric layer adjacent the barrier layer, wherein the dielectric layer has a dielectric constant less than 4.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
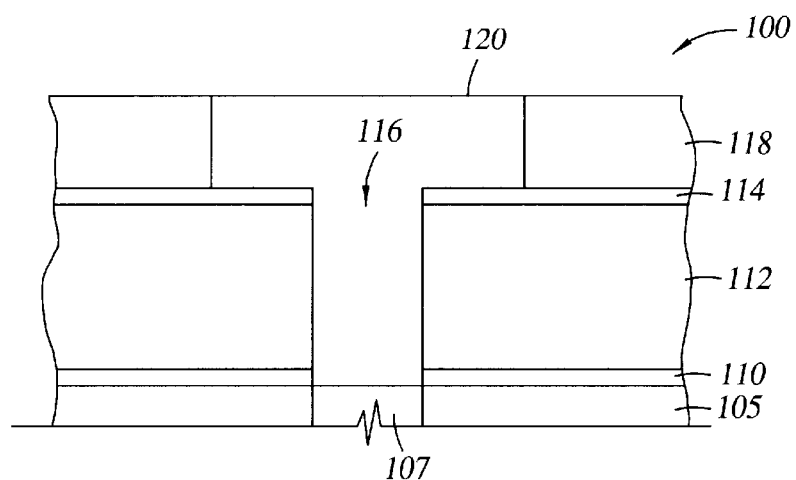
FIG. 1 is a cross sectional view showing a dual damascene structure comprising a low k barrier layer and a low k dielectric layer described herein.

To the extent a term used in a claim is not defined below, it should be given the broadest definition persons in the pertinent art have given that term, as reflected in printed publications and issued patents.

Aspects of the invention described herein refer to methods and precursors for depositing a silicon carbide barrier layer material having a low dielectric constant. The silicon carbide materials may be deposited by reacting a processing gas comprising hydrogen and an oxygen-free organosilicon compound having the formula $SiH_a(CH_3)_b(C_6H_5)_c$, wherein a is 0 to 3, b is 0 to 3, and c is 1 to 4, in a plasma to form a dielectric layer comprising carbon-silicon bonds and a dielectric constant less than 4, preferably less than about 3.5.

It was unexpectedly and surprising discovered by the inventors herein that depositing silicon carbide materials with hydrogen and an organosilicon compound having the formula $SiH_a(CH_3)_b(C_6H_5)_c$, wherein a is 0 to 3, b is 0 to 3, and c is 1 to 4, under the processing parameters described herein, produced a silicon carbide film having a dielectric constant of less than 4 with improved barrier layer properties, such as an interlayer diffusion resistance of about 100% greater than silicon carbide film produced by commercially available alkylsilane precursors, such as trimethylsilane (TMS). This is unexpected because it has been observed that phenyl groups increase the porosity of the deposited dielectric material, thereby reducing the interlayer diffusion resistance of the deposited dielectric material. The silicon carbide materials may be deposited as barrier layers adjacent dielectric layers comprising silicon, oxygen, and carbon, which adjacent barrier layers have a dielectric layer of less than about 3.

The oxygen-free organosilicon compounds used for depositing the silicon carbide materials generally include the structure:

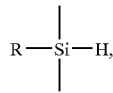

wherein R is a phenyl group. Suitable oxygen-free organosilicon compounds generally includes the formula $SiH_a(CH_3)_b(C_6H_5)_c$, wherein a is 0 to 3, b is 0 to 3, and c is 1 to 4, and a+b+c is equal to 4. Examples of suitable precursors derived from this formula include diphenylsilane, dimethylphenylsilane, diphenylmethylsilane, phenylmethylsilane, and combinations thereof. Preferably, b is 1 to 3 and c is 1 to 3. The most preferred organosilicon compounds for deposition as barrier layer materials include organosilicon compounds having the formula $SiH_a(CH_3)_b(C_6H_5)_c$, wherein a is 1 or 2, b is 1 or 2, and c is 1 or 2. Examples of preferred precursors include dimethylphenylsilane and diphenylmethylsilane.

The processing gas also includes hydrogen gas. The hydrogen gas is generally added at a molar ratio of oxygen-free organosilicon compound to hydrogen gas of between about 1:1 and about 10:1, such as between about 1:1 and about 6:1. Preferred deposition processes for oxygen-free organosilicon compounds and hydrogen gas has a molar ratio of oxygen-free organosilicon compound to hydrogen gas of between about 1:1 and about 1.5:1.

Optionally, an inert gas, such as a noble gas selected from the group of argon, helium, neon, xenon, or krypton, and combinations thereof, may be added to the processing gas to improve processing stability. Nitrogen gas ($N_2$) may also be added to the processing gas for depositing of the silicon carbide layer.

Additional materials, such as a second organosilicon compound, including siloxanes, or an organic compound, such as an aliphatic hydrocarbon, may also be present during the deposition process to modify or change desired film properties.

The second oxygen-free organosilicon compounds optionally used herein preferably include the structure:

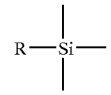

wherein R includes organic functional groups including alkyl, alkenyl, cyclohexenyl, and aryl groups, in addition to functional derivatives thereof. The organic precursors may have more than one R group attached to the silicon atom, and the invention contemplates the use of organosilicon precursors without Si—H bonds.

Suitable second oxygen-free organosilicon compounds include oxygen-free aliphatic organosilicon compounds, oxygen-free cyclic organosilicon compounds, or combinations thereof, having at least one silicon-carbon bond. Cyclic organosilicon compounds typically have a ring comprising three or more silicon atoms. Aliphatic organosilicon compounds have linear or branched structures comprising one or more silicon atoms and one or more carbon atoms. Commercially available aliphatic organosilicon compounds include alkylsilanes.

Examples of suitable second oxygen-free organosilicon compounds include one or more of the following compounds:

| | |
|---|---|
| Methylsilane, | $CH_3$—$SiH_3$ |
| Dimethylsilane, | $(CH_3)_2$—$SiH_2$ |
| Trimethylsilane (TMS), | $(CH_3)_3$—$SiH$ |
| Ethylsilane, | $CH_3$—$CH_2$—$SiH_3$ |
| Disilanomethane, | $SiH_3$—$CH_2$—$SiH_3$ |
| Bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —($SiH_2$—$CH_2$—)$_3$— (cyclic) |
| Diethylsilane | $(C_2H_5)_2SiH_2$ |
| Propylsilane | $C_3H_7SiH_3$ |
| Vinylmethylsilane | $(CH_2$=$CH)(CH_3)SiH_2$ |
| 1,1,2,2-tetramethyldisilane | $HSi(CH_3)_2$—$Si(CH_3)_2H$ |
| Hexamethyldisilane | $(CH_3)_3Si$—$Si(CH_3)_3$ |
| 1,1,2,2,3,3-hexamethyltrisilane | $H(CH_3)_2Si$—$Si(CH_3)_2$—$SiH(CH_3)_2$ |
| 1,1,2,3,3-pentamethyltrisilane | $H(CH_3)_2Si$—$SiH(CH_3)$—$SiH(CH_3)_2$ |
| Dimethyldisilanoethane | $CH_3$—$SiH_2$—$(CH_2)_2$—$SiH_2$—$CH_3$ |
| Dimethyldisilanopropane | $CH_3$—$SiH_2$—$(CH_2)_3$—$SiH_2$—$CH_3$ |
| Tetramethyldisilanoethane | $(CH)_2$—$SiH$—$(CH_2)_2$—$SiH$—$(CH)_2$ |
| Tetramethyldisilanopropane | $(CH_3)_2$—$SiH$—$(CH_2)_3$—$SiH$—$(CH_3)_2$ | and fluorinated hydrocarbon derivatives thereof.

The processing gas may further include oxygen-containing organosilicon compounds to modify or change desired film properties by controlling the oxygen content of the deposited silicon carbide film. Suitable oxygen-containing organosilicon compounds include oxygen-containing aliphatic organosilicon compounds, oxygen-containing cyclic organosilicon compounds, or combinations thereof. Oxygen-containing aliphatic organosilicon compounds have linear or branched structures comprising one or more silicon atoms and one or more carbon atoms, and the structure includes silicon-oxygen bonds.

Oxygen-containing cyclic organosilicon compounds typically have a ring comprising three or more silicon atoms and the ring may further comprise one or more oxygen atoms. Commercially available oxygen-containing cyclic organosilicon compounds include rings having alternating silicon and oxygen atoms with one or two alkyl groups bonded to each silicon atom. Preferred oxygen-containing organosilicon compounds are cyclic compounds.

One class of oxygen-containing organosilicon compounds include compounds having Si—O—Si bonding groups, such as organosiloxane compounds. Precursors with siloxane bonds provide silicon carbide films with bonded oxygen that can reduce the dielectric constant of the film as well as reduce the current leakage of the film.

Suitable oxygen-containing organosilicon compounds include, for example, one or more of the following compounds:

| | |
|---|---|
| Dimethyldimethoxysilane (DMDMOS), | $(CH_3)_2$—Si—$(OCH_3)_2$, |
| 1,3-dimethyldisiloxane, | $CH_3$—$SiH_2$—O—$SiH_2$—$CH_3$, |
| 1,1,3,3-tetramethyldisiloxane (TMDSO), | $(CH_3)_2$—SiH—O—SiH—$(CH_3)_2$, |
| Hexamethyldisiloxane (HMDS), | $(CH_3)_3$—Si—O—Si—$(CH_3)_3$, |
| Hexamethoxydisiloxane (HMDSO), | $(CH_3O)_3$—Si—O—Si—$(OCH_3)_3$, |
| 1,3-bis(silanomethylene)disiloxane, | $(SiH_3$—$CH_2$—$SiH_2$—$)_2$—O, |
| Bis(1-methyldisiloxanyl)methane, | $(CH_3$—$SiH_2$—O—$SiH_2$—$)_2$—$CH_2$, |
| 2,2-bis(1-methyldisiloxanyl)propane, | $(CH_3$—$SiH_2$—O—$SiH_2$—$)_2$—$C(CH_3)_2$ |
| 1,3,5,7-tetramethylcyclotetrasiloxane (TMCTS), | —(—$SiHCH_3$—O—)4— (cyclic), |
| Octamethylcyclotetrasiloxane (OMCTS), | —(—$Si(CH_3)_2$—O—)4— (cyclic), |
| 1,3,5,7,9-pentamethylcyclopentasiloxane, | —(—$SiHCH_3$—O—)5— (cyclic), |
| 1,3,5,7-tetrasilano-2,6-dioxy-4,8-dimethylene, | —(—$SiH_2$—$CH_2$—$SiH_2$—O—)$_2$— |
| Hexamethylcyclotrisiloxane | —(—$Si(CH_3)_2$—O—)$_3$— (cyclic), | and fluorinated hydrocarbon derivatives thereof. The above lists are illustrative and should not be construed or interpreted as limiting the scope of the invention.

When oxygen-containing and oxygen-free organosilicon precursors are used in the same processing gas, a molar ratio of oxygen-free organosilicon precursors to oxygen-containing organosilicon precursors between about 4:1 and about 1:1 is generally used.

Organic compounds, such as aliphatic hydrocarbon compounds may also be used in the processing gas to increase the carbon content of the deposited silicon carbide materials. Suitable aliphatic hydrocarbon compounds include compounds having between one and about 20 adjacent carbon atoms. The hydrocarbon compounds can include adjacent carbon atoms that are bonded by any combination of single, double, and triple bonds. For example, the organic compounds may include alkenes and alkynes having two to about 20 carbon atoms, such as ethylene, propylene, acetylene, and butadiene. Further examples of suitable hydrocarbons include t-butylethylene, 1,1,3,3-tetramethylbutylbenzene, t-butylether, metyl-methacrylate (MMA), t-butylfurfurylether, and combinations thereof. Organic compounds containing functional groups including oxygen and/or nitrogen containing functional groups may also be used. For example, alcohols, including ethanol, methanol, propanol, and iso-propanol, may be used for depositing the silicon carbide material.

In an alternative embodiment of the deposition process for low k dielectric materials, the processing gas described herein may further include one or more meta-stable organic compounds. Meta-stable compounds are described herein as compounds having unstable functional groups that dissociate under applied processing conditions, such as by temperature applied during an annealing process. The meta-stable organic compounds form unstable components within the layer network. The unstable components may be removed from the deposited material using a post anneal treatment. The removal of the unstable component during the post anneal treatment forms a void within the network and reducing the lower dielectric constant of the deposited material. The meta-stable compound is also known as a "leaving group" because of the nature of the process whereby the meta-stable compound leaves the network to form one or more voids therein. For example, a t-butyl functional group dissociated from the molecule at about 200° C. to form ethylene ($C_2H_4$) by a beta hydrogenation mechanism and evolves from the substrate surface leaving behind a void in the deposited material.

The meta-stable organic compounds may include t-butylethylene, 1,1,3,3-tetramethylbutylbenzene, t-butylether, metyl-methacrylate (MMA), and t-butylfurfurylether. The meta-stable compounds may also be in the form of aliphatic compounds described herein. It is believed that the meta-stable organic compounds further reduce the dielectric constant of the deposited film. Preferably, t-butylether is used as the meta-stable organic precursor in the processing gases.

Compounds having Si—N—Si bonding groups, such as silazane compounds, may be used in the processing gas for doping the deposited silicon carbide material with nitrogen. Compounds having bonded nitrogen, such as in the silazane compounds, can improve the hardness of films as well as reduced the current leakage of the films. Examples of suitable silazane precursors includes aliphatic compounds, such as hexamethyldisilazane and divinyltetramethyldisilizane, as well as cyclic compounds, such as hexamethylcyclotrisilazane. Nitrogen addition to the silicon carbide material may also occur by optionally including a nitrogen-containing gas, for example, ammonia ($NH_3$), nitrogen ($N_2$), or combinations thereof, in the processing gas.

The silicon carbide layer may also be doped with boron, phosphorus, or combinations thereof, to improve film properties. Doped silicon carbide generally includes less than about 15 atomic percent (atomic %) or less of any dopant including oxygen, nitrogen, boron, phosphorus, or combinations thereof. Dopants may be used in the processing gases at a ratio of dopant to organosilicon compound between about 1:5 or greater, such as between about 1:5 and about 1:100. Phosphorus and/or boron doping of the low k silicon carbide layer may be performed by introducing phosphine ($PH_3$) or borane ($BH_3$), or borane derivative thereof, such as diborane ($B_2H_6$), into the chamber during the deposition process. It is believed that dopants may reduce the dielectric constant of the deposited silicon carbide material.

A silicon carbide barrier layer may be deposited in one embodiment by supplying an organosilicon compound, such as diphenylsilane, to a plasma processing chamber at a flow rate between about 10 milligrams/minute (mgm) and about 1500 mgm, supplying hydrogen gas at a flow rate between about 10 sccm and about 2000 sccm, maintaining a substrate temperature between about 0° C. and about 500° C., maintaining a chamber pressure below about 500 Torr and an RF power of between about 0.03 watts/cm$^2$ and about 1500 watts/cm$^2$.

The RF power can be provided at a high frequency, such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. Additionally, the RF power may also be provided at low frequencies, such as 356 kHz, for depositing silicon carbide material.

The gas distributor may be positioned between about 300 mils and about 600 mils during the deposition process.

A suitable reactor for performing the processes described herein is a DxZ™ chemical vapor deposition chamber commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The above process parameters provide a deposition rate for the silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

An example of a preferred silicon carbide barrier layer deposition process includes introducing dimethylphenylsilane at about 1000 mg/min into the processing chamber, introducing hydrogen at about 500 sccm into the processing chamber, introducing helium at about 1000 sccm into the processing chamber, generating a plasma in the processing chamber by applying 200 watts of RF energy, maintaining the substrate temperature at about 350° C., maintaining the chamber pressure at about 6 Torr to deposit a silicon carbide layer. The spacing between the gas distributor and the substrate surface was 450 mil. A silicon carbide layer is deposited at about 1300 Å/min by this process. The deposited silicon carbide layer exhibited a dielectric constant of about 3.4.

Post-Deposition Treatment

Following deposition, the deposited low dielectric constant material may be annealed at a temperature between about 100° C. and about 400° C. for between about 1 minute and about 60 minutes, preferably at about 30 minutes, to reduce the moisture content and increase the solidity and hardness of the dielectric material. Annealing is preferably performed after the deposition of a subsequent material or layer that prevents shrinkage or deformation of the dielectric layer. The annealing process is typically formed using inert gases, such as argon and helium, but may also include hydrogen. The above described annealing process is preferably used for low dielectric constant materials deposited from processing gases without meta-stable compounds.

Alternatively, for materials deposited from processing gases containing meta-stable compounds, a post deposition anneal is used to remove unstable components from the layer as well as reduce the moisture content of the film. Moisture content may arise due to exposure to ambient air or by-product formation, for example. The anneal process is preferably performed prior to the subsequent deposition of additional materials. Preferably, an in-situ (i.e., inside the same chamber or same processing system without breaking vacuum) post treatment is performed.

The material containing unstable components is subjected to a temperature between about 100° C. and about 400° C. for between about 2 seconds and about 10 minutes, preferably about 30 seconds. The annealing gas includes helium, hydrogen, or a combination thereof, which is flowed into the chamber at a rate between about 200 sccm and about 10,000 sccm, such as between about 500 and about 1,500 sccm. The chamber pressure is maintained between about 2 Torr and about 10 Torr. A gas distribution head for providing the annealing gas to the process chamber is disposed between about 300 mils and about 600 mils from the substrate surface.

The annealing process is preferably performed in one or more cycles using helium. The annealing process may be performed more than once, and variable amounts of helium and hydrogen may be used in multiple processing steps or annealing steps. The post anneal may be performed in substitution or prior to the anneal step previously described herein. For example, a second in-situ anneal process may be performed on the materials deposited from processing gases containing meta-stable compounds following the initial anneal process to remove meta-stable components. The second anneal process that may be performed is the anneal process for deposited material that do not have meta-stable components as previously described herein. Alternatively, a RF power may be applied to the annealing gas between about 200 W and about 1,000 W, such as between about 200 W and about 800 W, at a frequency of about 13.56 MHz for a 200 mm substrate.

Alternatively, or additionally, the deposited silicon carbide layer may be plasma treated to remove contaminants or other wise clean the exposed surface of the silicon carbide layer prior to subsequent deposition of materials thereon. The plasma treatment may be performed in the same chamber used to deposit the silicon and carbon containing material. The plasma treatment is also believed to improve film stability by forming a protective layer of a higher density material than the untreated silicon carbide material. The higher density silicon carbide material is believed to be more resistive to chemical reactions, such as forming oxides when exposed to oxygen, than the untreated silicon carbide material.

The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The inert gas or reducing gas is introduced into the processing chamber at a flow rate between about 500 sccm and about 3000 sccm, preferably between about 1000 sccm and about 2500 sccm of hydrogen, and generating a plasma in the processing chamber.

The plasma may be generated using a power density ranging between about 0.03 W/cm$^2$ and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. Alternatively, the RF power may also be provided at low frequencies, such as 356 kHz, for plasma treating the depositing silicon carbide layer.

The processing chamber is preferably maintained at a chamber pressure of between about 1 Torr and about 12 Torr, for example about 3 Torr. The substrate is preferably maintained at a temperature between about 200° C. and about 450° C., preferably between about 290° C. and about 400° C., during the plasma treatment. A substrate temperature of about the same temperature of the silicon carbide deposition process, for example about 290° C., may be used during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils from the substrate surface. The gas distributor may be positioned between about 300 mils and about 600 mils during the plasma treatment.

The hydrogen containing plasma treatment is believed to further reduce the dielectric constant of the low k dielectric layer by about 0.1 or less. The plasma treatment is believed to clean contaminants from the exposed surface of the silicon carbide material and may be used to stabilize the layer, such that it becomes less reactive with moisture and/or oxygen under atmospheric condition as well as the adhesion of layers formed thereover.

However, it should be noted that the respective parameters may be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma treatment to Enhance adhesion and to Minimize Oxidation of Carbon-Containing Layers," filed on Jun. 18, 1999, which is incorporated herein by reference to the extent not inconsistent with the disclosure and claimed aspects of the invention described herein.

Alternatively, the silicon carbide layer may also be treated by depositing a silicon carbide cap layer or silicon oxide cap layer prior to depositing a photoresist material. The cap layer may be deposited at a thickness between about 100 Å and about 500 Å. The use of a cap layer is more fully described in co-pending U.S. patent application Ser. No. 09/977,008, entitled "Method Of Eliminating Photoresist Poisoning In Damascene Applications", filed on Oct. 11, 2001, which is incorporated herein by reference to the extent not inconsistent with the claimed aspects and disclosure described herein.

Electron Beam Treatment

In another aspect of the invention, the deposited silicon carbide material may be cured by an electronic beam (e-beam) technique. Silicon carbide material cured using an e-beam technique has shown an unexpected reduction in k value and an unexpected increase in hardness, not capable with conventional curing techniques. The e-beam treatment may be performed in situ within the same processing system, for example, transferred from one chamber to another without break in a vacuum. The following e-beam apparatus and process are illustrative, and should not be construed or interpreted as limiting the scope of the invention.

Figure 3:
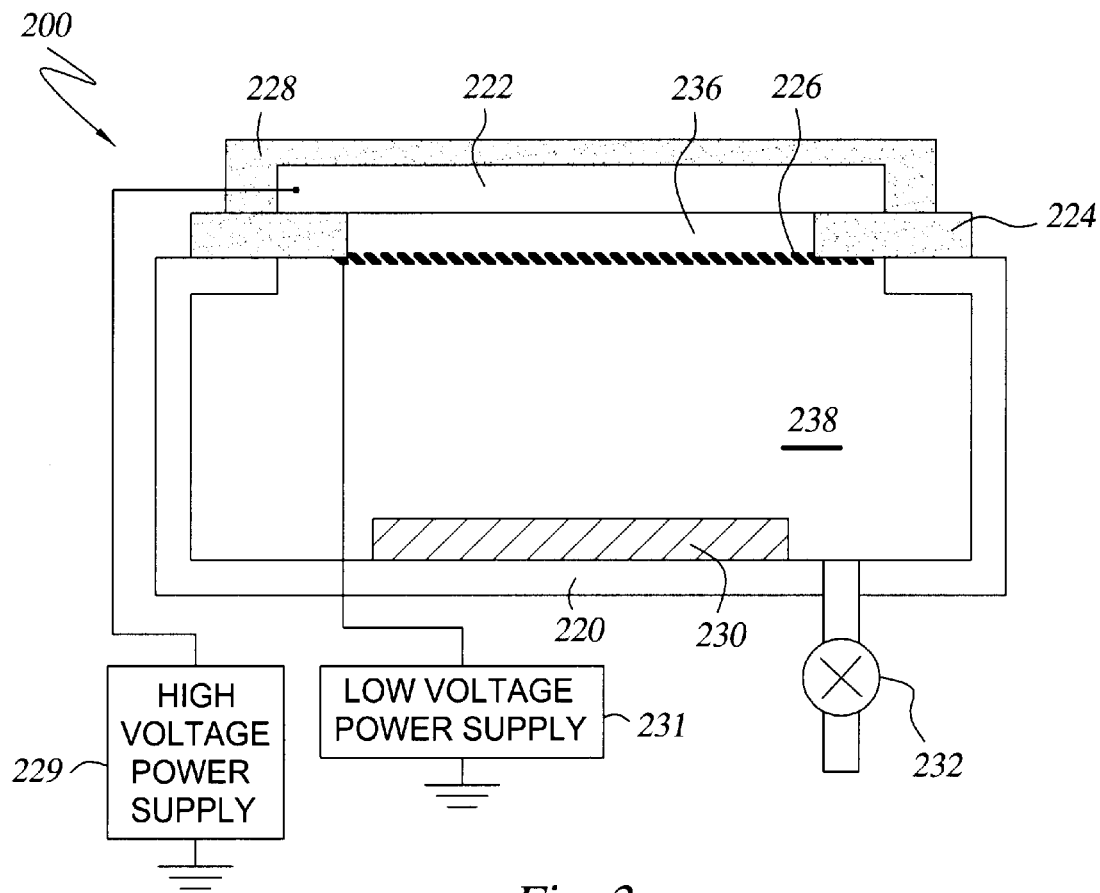
FIG. 3 is a schematic view of one embodiment of an electron beam apparatus.

FIG. 3 illustrates an electron beam apparatus 200 in accordance with an embodiment of the invention. The chamber 200 includes a vacuum chamber 220, a large-area cathode 222, a target plane 230 located in a field-free region 238, and a grid anode 226 positioned between the target plane 230 and the large-area cathode 222. The chamber 200 further includes a high voltage insulator 224, which isolates the grid anode 226 from the large-area cathode 222, a cathode cover insulator 228 located outside the vacuum chamber 220, a variable leak valve 232 for controlling the pressure inside the vacuum chamber 220, a variable high voltage power supply 229 connected to the large-area cathode 222, and a variable low voltage power supply 231 connected to the grid anode 226.

In operation, the substrate (not shown) to be exposed with the electron beam is placed on the target plane 230. The vacuum chamber 220 is pumped from atmospheric pressure to a pressure in the range of about 1 mTorr to about 200 mTorr. The exact pressure is controlled by the variable rate leak valve 232, which is capable of controlling pressure to about 0.1 mTorr. The electron beam is generally generated at a sufficiently high voltage, which is applied to the large-area cathode 222 by the high voltage power supply 229. The voltage may range from about −500 volts to about 30,000 volts or higher. The high voltage power supply 229 may be a Bertan Model #105-30R manufactured by Bertan of Hickville, N.Y., or a Spellman Model #SL30N-1200X 258 manufactured by Spellman High Voltage Electronics Corp., of Hauppauge, N.Y. The variable voltage power supply 231 applies a voltage to the grid anode 226 that is positive relative to the voltage applied to the large-area cathode 222. This voltage is used to control electron emission from the large-area cathode 222. The variable voltage power supply 231 may be an Acopian Model #150PT12 power supply available from Acopian of Easton, Pa.

Figure 4:
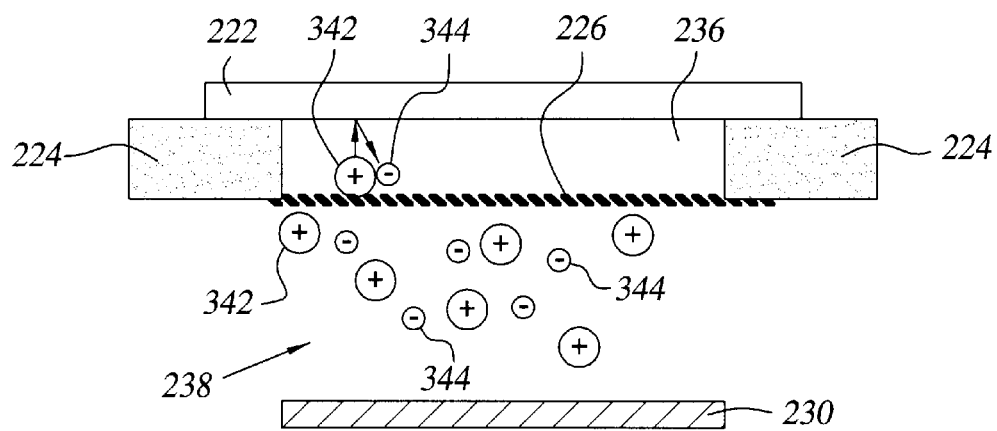
FIG. 4 is a partial schematic side view of one embodiment of the electron beam apparatus.

To initiate electron emission, the gas in the space between the large-area cathode 222 and the target plane 30 must become ionized, which may occur as a result of naturally occurring gamma rays. Electron emission may also be artificially initiated inside the vacuum chamber 220 by a high voltage spark gap. Once this initial ionization takes place, positive ions 342 (shown in FIG. 4) are attracted to the grid anode 226 by a slightly negative voltage, i.e., on the order of about 0 to about −200 volts, applied to the grid anode 226. These positive ions 342 pass into the accelerating field region 236, disposed between the large-area cathode 222 and the grid anode 226, and are accelerated towards the large-area cathode 222 as a result of the high voltage applied to the large-area cathode 222. Upon striking the large-area cathode 222, these high-energy ions produce secondary electrons 344, which are accelerated back toward the grid anode 226. Some of these electrons, which travel generally perpendicular to the cathode surface, strike the grid anode 226, but many pass through the anode 226 and travel to the target plane 230. The grid anode 226 is preferably positioned at a distance less than the mean free path of the electrons emitted by the large-area cathode 222, e.g., the grid anode 226 is preferably positioned less than about 4 mm from the large-area cathode 222. Due to the short distance between the grid anode 226 and the large-area cathode 222, no, or minimal if any, ionization takes place in the accelerating field region 236 between the grid anode 226 and the large-area cathode 222.

In a conventional gas discharge device, the electrons would create further positive ions in the accelerating field region, which would be attracted to the large-area cathode 222, creating even more electron emission. The discharge could easily avalanche into an unstable high voltage breakdown. However, in accordance with an embodiment of the invention, the ions 342 created outside the grid anode 226 may be controlled (repelled or attracted) by the voltage applied to the grid anode 226. In other words, the electron emission may be continuously controlled by varying the voltage on the grid anode 226. Alternatively, the electron emission may be controlled by the variable leak valve 232, which is configured to raise or lower the number of molecules in the ionization region between the target plane 230 and the large-area cathode 222. The electron emission may be entirely turned off by applying a positive voltage to the grid anode 226, i.e., when the grid anode voltage exceeds the energy of any of the positive ion species created in the space between the grid anode 226 and target plane 230.

Figure 5:
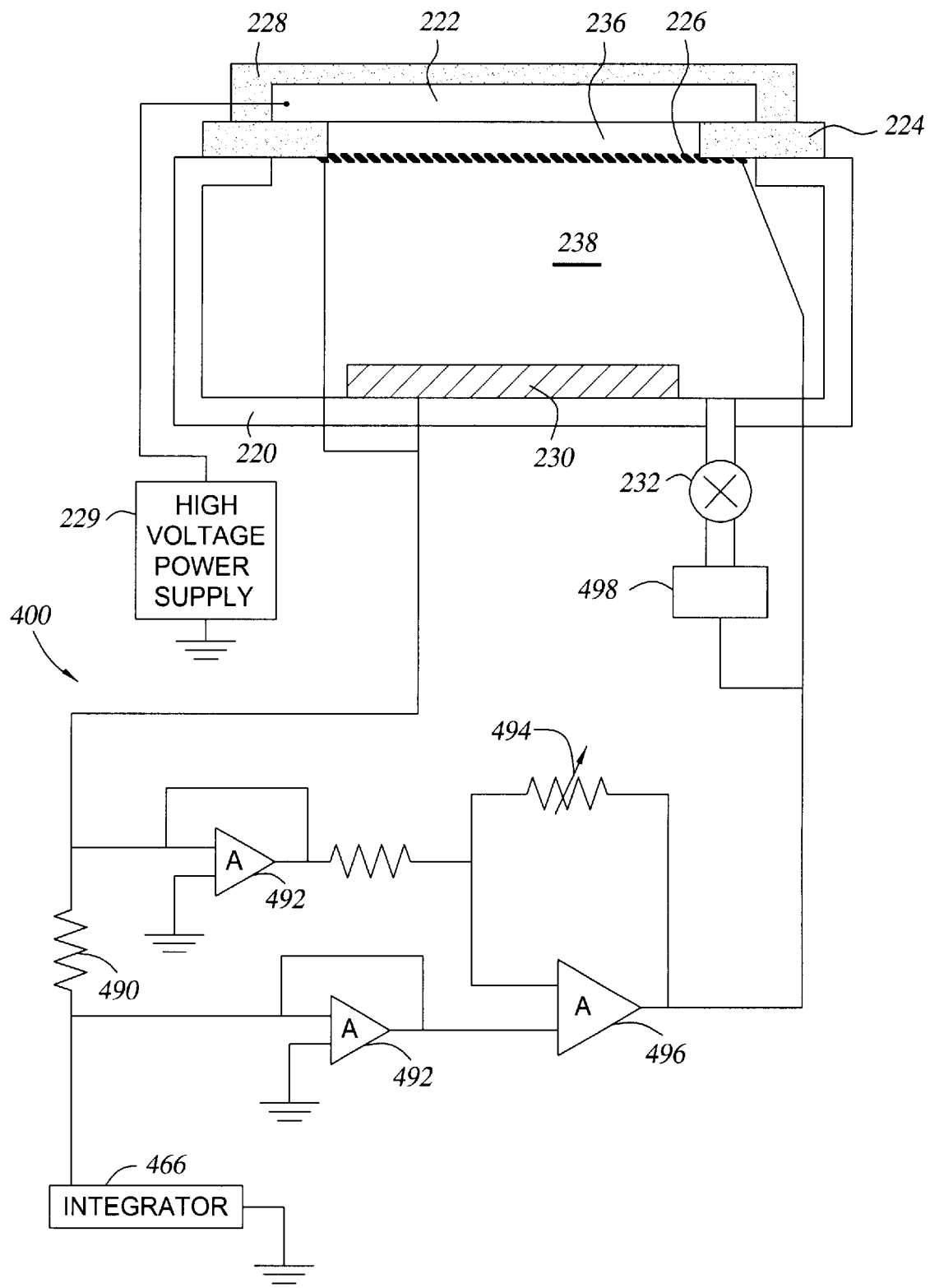
FIG. 5 illustrates one embodiment of the electron beam apparatus with a feedback control circuit; and For a further understanding of aspect of the invention, reference should be made to the ensuing detailed description.

FIG. 5 illustrates the electron beam apparatus 200 with a feedback control circuit 400. In some applications it may be desirable to provide a constant beam current at different electron beam energies. For example, it may be desirable to expose or cure the upper layer of the film formed on the substrate, but not the bottom layer. This may be accomplished by lowering the electron beam energy such that most of the electrons are absorbed in the upper layer of the film. Subsequent to curing the top layer, it may be desirable to cure the full thickness of the film. This can be done by raising the accelerating voltage of electron beam to penetrate completely through the film. The feedback control circuit 400 is configured to maintain a constant beam current independent of changes in the accelerating voltage. The feedback control circuit 400 includes an integrator 466. The beam current is sampled via a sense resistor 490, which is placed between the target plane 230 and the integrator 466. The beam current may also be sampled at the grid anode 226 as a portion of the beam is intercepted there. Two unity gain voltage followers 492 buffer the signal obtained across the sense resistor 490 and feed it to an amplifier 496 with a variable resistor 494. The output of this amplifier controls the voltage on the grid anode 226 such that an increase in beam current will cause a decrease in bias voltage on the grid anode 226 and a decrease in beam current from the large-area cathode 222. The gain of the amplifier 496 is adjusted, by means of the variable resistor 494, so that any change in beam current caused by a change in the accelerating voltage is counteracted by a change in bias voltage, thereby maintaining a constant beam current at the target. Alternatively, the output of the amplifier 496 may be connected to a voltage controlled variable rate leak valve 298 to counteract changes in beam current by raising or lowering the pressure in the ionization region 238. Further, a wider range of beam current control may be provided by utilizing feedback signals to both the variable leak valve 298 and the grid anode 226. Other details of the electron beam apparatus 200 are described in U.S. Pat. No. 5,000,178, entitled "Large-Area Uniform Electron Source", issued to William R. Livesay, assigned to Electron Vision Corporation (which is currently owned by the assignee of the invention) and is incorporated by reference herein to the extent not inconsistent with the invention.

The temperature at which the electron beam apparatus 200 operates ranges from about −200 degrees Celsius to about 600 degrees Celsius, e.g., about 400 degrees Celsius. An e-beam treatment of a silicon carbide layer may comprise the application or exposure to between about 1 micro coulombs per square centimeter ($\mu C/cm^2$) and about 6,000 $\mu C/cm^2$, for example, between about 1 $\mu C/cm^2$ and about 400 $\mu C/cm^2$, and more preferably less than about 200 $\mu C/cm^2$, such as about 70 $\mu C/cm^2$, at energy ranges between about 0.5 kiloelectron volts (KeV) and about 30 KeV, for example between about 1 KeV and about 3 kiloelectron volts (KeV). The electron beams are generally generated at a pressure of about 1 mTorr to about 100 mTorr. The gas ambient in the electron beam chamber 220 may be an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 5 mA to about 20 mA. The electron beam may cover an area from about 4 square inches to about 700 square inches. Although any e-beam device may be used, one exemplary device is the EBK chamber, available from Applied Materials, Inc., of Santa Clara Calif.

The e-beam curing process is believed to improve the mechanical strength to the deposited film network and also reduce the k-value of the deposited silicon carbide material. The e-beam process adds energy to the deposited network and removes at least a portion of any cyclic organic groups disposed in any deposited material. The removal of the cyclic groups creates voids or pores within the film, thus lowering the k value. E-beam processing is more fully described in U.S. patent Application Ser. No. 10/302,375, entitled, "Method For Curing Low Dielectric Constant Film By Electron Beam", filed on Nov. 22, 2002, and incorporated herein by reference to the extent not inconsistent with the claims aspects and disclosure herein.

An example of an e-beam process is as follows. A substrate having a 3000 Å thick film is exposed to an e-beam at a chamber temperature about 400 degrees Celsius, an applied electron beam energy of about 3.5 KeV, and at an electron beam current of about 5 mA, with an exposure dose of the electron beam of about 500 $mC/cm^2$.

Deposition and Post-treatment Example

Silicon Carbide Layer

A silicon carbide layer was deposited on a 200 mm substrate by supplying dimethylphenylsilane to a processing chamber at a flow rate of about 750 mg/min, supplying hydrogen gas at a flow rate of about 500 sccm, supplying hydrogen gas at a flow rate of about 1500 sccm, maintaining a substrate temperature of about 350° C., maintaining a chamber pressure of about 6 Torr, a spacing between the gas distributor and the substrate surface of about 450 mils, and a RF power of about 200 watts at a frequency of about 13.56 MHz. The process is performed for about 46 seconds for a 1000 Å thick layer. The deposited silicon carbide material was observed to have a dielectric constant of about 3.5.

After deposition, the silicon carbide layer was capped with a hard mask layer if silicon carbide deposited by supplying trimethylsilane (TMS) to a processing chamber at a flow rate of about 320 sccm and supplying helium at a flow rate of about 800 sccm, maintaining a substrate temperature of about 350° C., maintaining a chamber pressure of about 8.7 Torr, a spacing between the gas distributor and the substrate surface of about 450 mils, and a RF power of about 500 watts at a frequency of about 13.56 MHz for about 3 seconds.

Alternatively, the layer may be post-treated by using an electron beam apparatus, such as the electron beam apparatus 200 described above, at a chamber temperature about 400 degrees Celsius, an applied electron beam energy of about 3.5 KeV, and at an electron beam current of about 5 mA, with an exposure dose of the electron beam of about 500 mC/cm$^2$.

Deposition of a Barrier Layer for a Dual Damascene Structure

The barrier layers are preferably deposited adjacent dielectric layers comprising silicon, oxygen, and carbon, a dielectric constant of less than about 3. The adjacent dielectric layers for use with the barrier layer material described herein have a carbon content of about 1 atomic percent excluding hydrogen atoms, preferably between about 5 and about 30 atomic percent excluding hydrogen atoms. The adjacent dielectric layer may be deposited by oxidizing an organosilane compound in a plasma enhanced chemical vapor deposition technique. For example, a suitable adjacent dielectric material may be deposited by reacting trimethylsilane and oxygen in a plasma enhanced chemical vapor deposition technique, with the plasma formed under conditions including a high frequency RF power density from about 0.16 W/cm$^2$ to about 0.48 W/cm$^2$.

Examples of methods and uses for the adjacent dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, which are incorporated by reference herein to the extent not inconsistent with the disclosure and claimed aspects described herein. An example of a dielectric layer comprising silicon, oxygen, and carbon, having a dielectric constant of less than about 3 is Black Diamond™ dielectric materials commercially available from Applied Materials, Inc., of Santa Clara, Calif.

The embodiments described herein for depositing silicon carbide layers adjacent low k dielectric layers are provided to illustrate the invention and the particular embodiment shown should not be used to limit the scope of the invention.

An example of a damascene structure that is formed using the silicon carbide material described herein as a barrier layer is shown in FIG. 1. A silicon carbide barrier layer 110 is generally deposited using the precursors according to the processes described herein on the substrate surface to eliminate inter-level diffusion between the substrate and subsequently deposited material. The substrate surface may comprise metal features 107 formed in a dielectric material 105.

A first dielectric layer 112, comprising silicon, oxygen, and carbon, as described herein, is deposited on the silicon carbide barrier layer 110 on the substrate surface including metal features 107 formed in a dielectric material 105. An etch stop (or second barrier layer) 114 of a silicon carbide material or oxidized organo silane layer is then deposited on the first dielectric layer 112. The etch stop 114 may include a silicon carbide material deposited from the organosilicon precursors described herein or an oxidized organosilane layer. Alternatively, the etch stop 114 may be a nitrogen containing silicon carbide material. Examples of nitrogen containing silicon carbide materials are more fully described in U.S. patent application Ser. No. 09/793,818, filed on Feb. 23, 2001, and in U.S. patent application Ser. No. 09/627,667, filed on Jul. 28, 2000, which are incorporated by reference herein to the extent not inconsistent with the disclosure or claimed aspects described herein. The etch stop 114 is then pattern etched to define the openings of the interconnects or contacts/vias 116.

A second dielectric layer 118 is then deposited over the patterned etch stop. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including a silicon carbide barrier layer deposited by the processes described herein is sequentially depicted schematically in FIGS. 2A–2H, which are cross sectional views of a substrate having the steps of the invention formed thereon.

Figure 2A:
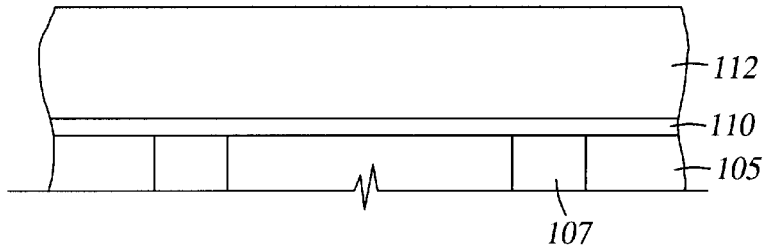
FIGS. 2A–2H are cross sectional views showing one embodiment of a dual damascene deposition sequence of the invention.

As shown in FIG. 2A, a silicon carbide barrier layer 110 is deposited on the substrate surface from the processes described herein. The silicon carbide barrier layer 110 may be deposited by introducing dimethylphenylsilane at about 750 mg/min into the processing chamber, introducing hydrogen at about 500 sccm into the processing chamber, introducing hydrogen at about 1500 sccm into the processing chamber, generating a plasma in the processing chamber by applying 200 watts of RF energy, maintaining the substrate temperature at about 350° C., maintaining the chamber pressure at about 6 Torr to deposit a silicon carbide layer. The silicon carbide material is deposited at about 1300 Å/min by this process. The deposited silicon carbide layer has a dielectric constant of about 3.5.

The silicon carbide barrier layer 110 may be e-beam or plasma treated as described herein. The e-beam or plasma treatment may be performed in situ with the deposition of the silicon carbide material. Such an e-beam or plasma treatment is believed to clean contaminants from the exposed surface of the silicon carbide material and may be used to stabilize the layer, such that it becomes less reactive with moisture and/or oxygen under atmospheric condition as well as the adhesion of layers formed thereover. Alternatively, or additionally, a capping layer (not shown) of a nitrogen free silicon carbide material may be deposited on the barrier layer 110. The nitrogen free silicon carbide capping layer may be deposited in situ on the silicon carbide layer 110. The capping layer is preferably deposited after any e-beam or plasma treatment of silicon carbide layer 110.

An example of a plasma treatment process includes a processing gas of helium or a reducing gas, such as hydrogen, at a power level of between about 200 watts and about 800 watts for between about 5 seconds and about 60 seconds for a 200 millimeter substrate. The processing chamber is maintained at a pressure of about 8.7 Torr or less and at a substrate temperature of about the deposition temperature of the layer, for example about 350° C. for dimethylphenylsilane, during the reactive clean process.

An example of a e-beam process includes exposing silicon carbide barrier layer 110 at a chamber temperature about 400° C., an applied electron beam energy of about 3.5 KeV, and at an electron beam current of about 5 mA, with an exposure dose of the electron beam of about 500 mC/cm$^2$. The first dielectric layer 112 of interlayer dielectric material is deposited on the first silicon carbide barrier layer 110 by oxidizing an organosilane or organosiloxane, such as trimethylsilane, to a thickness of about 5,000 to about 15,000 Å, depending on the size of the structure to be fabricated. An example of a low dielectric constant material that may be used as an interlayer dielectric material is Black Diamond™ dielectric commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG).

The first dielectric layer 112 may then be treated by an e-beam technique or a plasma treatment process including helium or a reducing gas, such as hydrogen, as described herein for the silicon carbide layer. The processing chamber is maintained at a pressure and at a substrate temperature of about the deposition pressure and temperature of the first dielectric layer 112 during the reactive clean process.

Figure 2B:
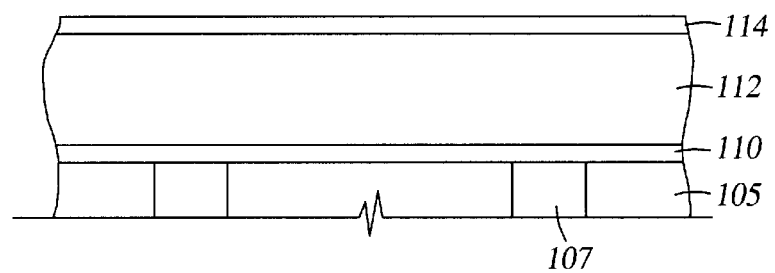

As shown in FIG. 2B, the low k etch stop 114, which may be a silicon carbide material, is then deposited on the first dielectric layer to a thickness of about 200 to about 1000 Å. The low k etch stop 114 may be deposited from the same precursors and by the same process as the silicon carbide barrier layer 110. The low k etch stop 114 may be e-beam or plasma treated as described herein for the silicon carbide barrier layer 110. A capping layer (not shown) may also be deposited on the low k etch stop layer 114 as described for the silicon carbide barrier layer 100 described herein.

Figure 2C:
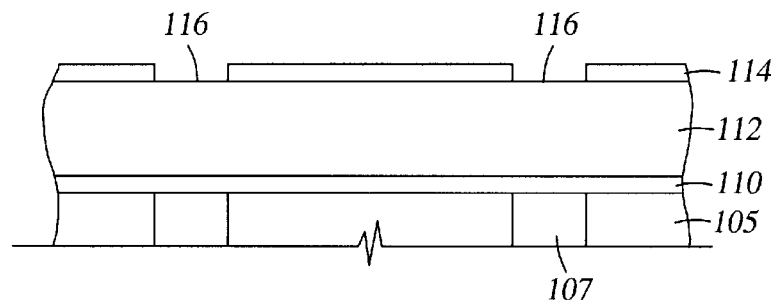

The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 114 prior to depositing further materials.

Figure 2D:
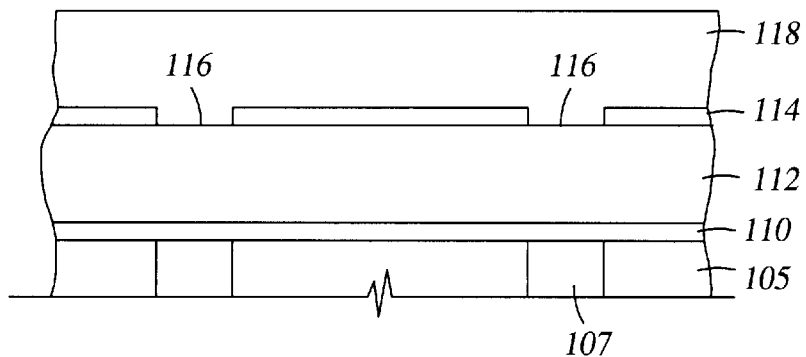

After low k etch stop 114 has been etched to pattern the contacts/vias and the photoresist has been removed, a second dielectric layer 118 of silicon oxycarbide is deposited to a thickness of about 5,000 to about 15,000 Å as shown in FIG. 2D. The second dielectric layer 118 may be deposited as described for the first dielectric layer 112 as well as comprise the same materials used for the first dielectric layer 112. The second dielectric layer 118 may be plasma treated as the first dielectric layer 112. The e-beam or plasma treatment is believed to reduce the reactivity of the surface of the layer 118 to subsequently deposited materials.

In an alternative embodiment, a nitrogen-free silicon carbide or silicon oxide cap layer between about 100 Å and about 500 Å thick may be deposited on second dielectric layer 118 prior to depositing additional materials, such as photoresist materials. In a further alternative embodiment, a silicon carbide cap layer (not shown) may be deposited from the same precursors are by the same process as the silicon carbide barrier layer 110 on the second dielectric layer 118 prior to depositing additional materials, such as photoresist materials.

Figure 2E:
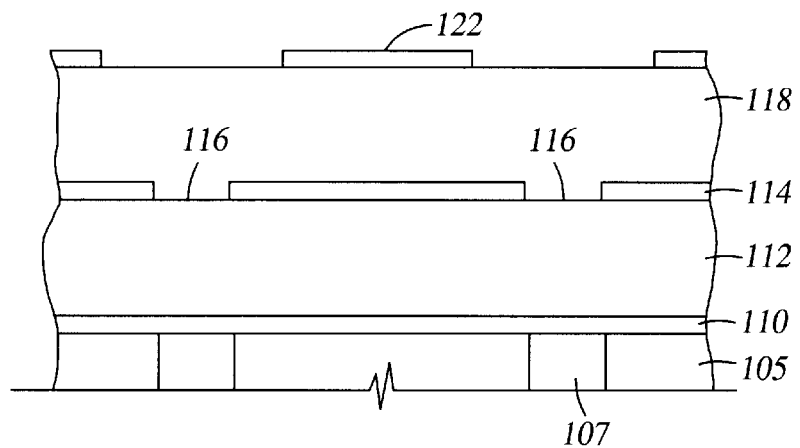
Figure 2F:
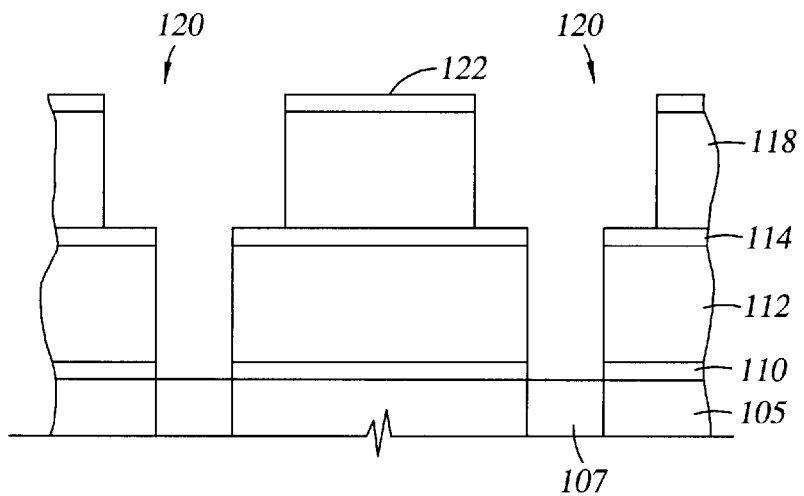

A photoresist material 122 is then deposited on the second dielectric layer 118 (or cap layer) and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
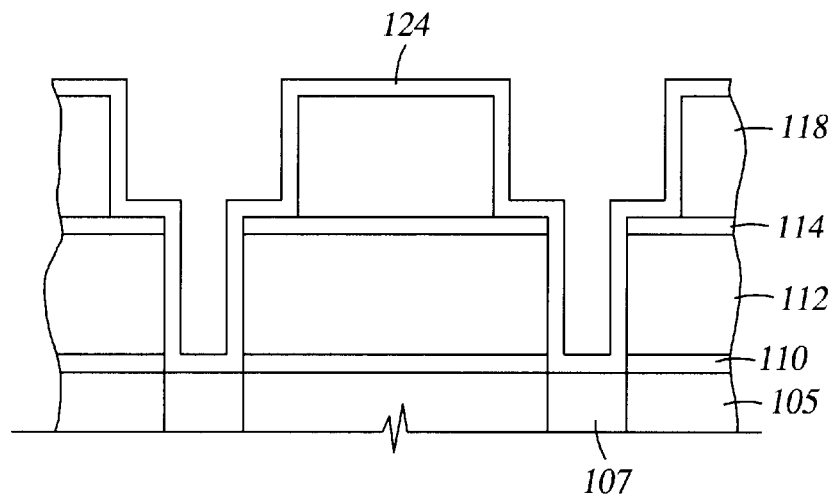
Figure 2H:
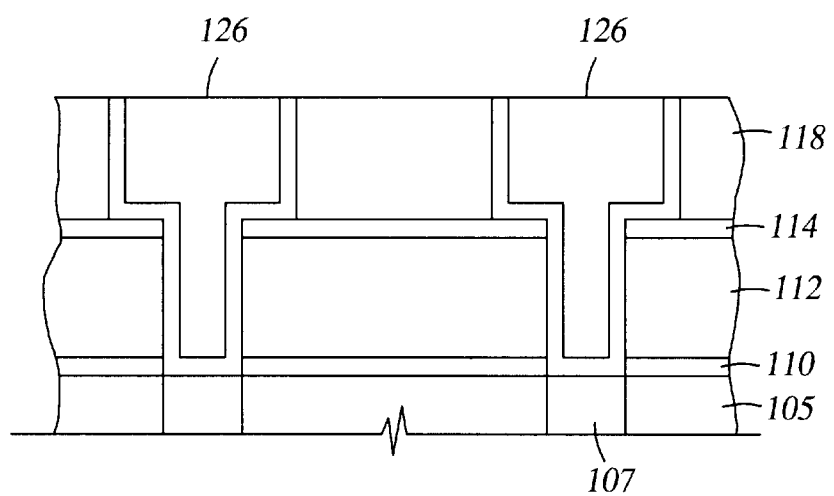

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 2G, a suitable barrier layer 124 for copper, such as tantalum or tantalum nitride, is first deposited conformally in the metallization pattern to prevent copper migration into the surrounding silicon and/or dielectric material. Thereafter, copper 126 is deposited using chemical vapor deposition, physical vapor deposition, electroplating, or combinations thereof to form the conductive structure. Once the structure has been filled with copper or other metal, the surface is planarized using chemical mechanical polishing, as shown in FIG. 2H.

Examples

Organosilicon compounds described herein were deposited as barrier layers on substrate surface and analyzed. In one example, a silicon carbide film was deposited from a diphenylsilane compound and compared to a silicon carbide film from a conventional silicon carbide precursor, trimethylsilane.

Both diphenylsilane and trimethylsilane precursors were deposited by introducing diphenylsilane or trimethylsilane at about 500 mg/min into the processing chamber, introducing helium at about 500 sccm into the processing chamber, generating a plasma in the processing chamber by applying 100 watts of RF energy, maintaining the substrate temperature at about 290° C., maintaining the chamber pressure at about 3 Torr to deposit a silicon carbide layer. The heater spacing was about 450 mils from the substrate surface.

The deposited films were examined and analyzed for dielectric constant and barrier layer diffusion. The diphenylsilane silicon carbide film had a measured dielectric constant of about 3.4 and the trimethylsilane silicon carbide film had a measured dielectric constant of about 4.3.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the diphenylsilane silicon carbide had a leakage current of about 1 $e^{-9}$ amps/cm$^2$ at 1 mega volts/cm (MV/cm) and about 1 $e^{-8}$ amps/cm$^2$ at 2 MV/cm and had a 50% failure rate after about 7.9 hours while the trimethylsilane silicon carbide film had a leakage current of about 1 $e^{-9}$ amps/cm$^2$ at 1 MV/cm and about 1 $e^{-6}$ amps/cm$^2$ at 2 MV/cm and had a 50% failure rate after about 4.4 hours.

In a further example, dimethylphenylsilane was used to deposit a silicon carbide layer by introducing the dimethylphenylsilane at about 750 mg/min into the processing chamber, introducing hydrogen at about 500 sccm into the processing chamber, introducing helium at about 1500 sccm into the processing chamber, generating a plasma in the processing chamber by applying 200 watts of RF energy, maintaining the substrate temperature at about 350° C., maintaining the chamber pressure at about 6 Torr to deposit a silicon carbide layer. The heater spacing was about 450 mils from the substrate surface.

The deposited films were examined and analyzed for dielectric constant and barrier layer diffusion. The dimethylphenylsilane silicon carbide film had a measured dielectric constant of about 3.5 compared to about 4.3 for trimethylsilane deposited silicon carbide films. Comparison of the films indicated that the dimethylphenylsilane silicon carbide had a leakage current of about $1\ e^{-9}$ amps/cm$^2$ at 1 MV/cm and about $3\ e^{-8}$ amps/cm$^2$ at 2 MV/cm and had a 50% failure rate after about 11 hours while the trimethylsilane silicon carbide film had a leakage current of about $1\ e^{-9}$ amps/cm$^2$ at 1 MV/cm and about $1\ e^{-6}$ amps/cm$^2$ at 2 MV/cm and had a 50% failure rate after about 4.4 hours. The dimethylphenylsilane silicon carbide film has a stable film stress at a level of about $1.2\ e^{-9}$ Dyne/cm$^2$ for a 3000 Å thick layer.

This data indicates a significant and unexpected improvement in barrier layer properties and dielectric constant for diphenylsilane or alkyl substituted diphenylsilane compounds in comparison to available barrier layer processes.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate, comprising:
   depositing a barrier layer on the substrate by introducing a processing gas comprising hydrogen and an oxygen-free organosilicon compound into a processing chamber, wherein the oxygen-free organosilicon compound has the formula $SiH_a(CH_3)_b(C_6H_5)_c$, wherein a is 0 to 3, b is 0 to 3, and c is 1 to 4, and reacting the processing gas to deposit the barrier layer, wherein the barrier layer has a dielectric constant less than 4; and
   depositing a first dielectric layer adjacent the barrier layer, wherein the dielectric layer comprises silicon, oxygen, and carbon and has a dielectric constant of about 3 or less.

2. The method of claim 1, wherein the oxygen-free organosilicon compound comprises diphenylmethylsilane, dimethylphenylsilane, or combinations thereof.

3. The method of claim 1, wherein the processing gas further includes an oxygen-containing organosilicon compound, an aliphatic hydrocarbon, or combinations thereof.

4. The method of claim 3, wherein the oxygen-containing organosilicon compound comprises dimethyldimethoxysilane.

5. The method of claim 3, wherein the aliphatic hydrocarbon selected from the group of ethylene, alcohol, and combinations thereof.

6. The method of claim 1, wherein the processing gas further comprises nitrogen.

7. The method of claim 1, wherein the processing gas further includes a dopant component selected from the group of a nitrogen-containing compound, a boron-containing compound, a phosphorus-containing compound, and combinations thereof.

8. The method of claim 7, wherein the nitrogen-containing compound is selected from the group of nitrogen gas, ammonia, a silazane, and combinations thereof.

9. The method of claim 1, wherein the dielectric layer is deposited prior to depositing the barrier layer, subsequent to the barrier layer, or both.

10. The method of claim 1, wherein the reacting the processing gas comprises generating a plasma by a high frequency RF power.

11. The method of claim 10, wherein the reacting the processing gas further comprises applying a low frequency RF power.

12. The method of claim 1, further comprising depositing a hardmask capping layer on the barrier layer.

13. The method of claim 1, wherein the deposited barrier layer is treated to an e-beam curing technique prior to subsequent processing.

14. A method for processing a substrate, comprising:
    depositing a barrier layer on the substrate by introducing a processing gas comprising hydrogen and an oxygen-free organosilicon compound into a processing chamber, wherein the oxygen-free organosilicon compound has the formula $SiH_a(CH_3)_b(C_6H_5)_c$, wherein a is 1 or 2, b is 1 or 2, and c is 1 or 2, and reacting the processing gas to deposit the barrier layer, wherein the barrier layer has a dielectric constant of less than 4;
    treating the deposited barrier layer to an e-beam curing technique; and
    depositing a dielectric layer adjacent the barrier layer, wherein the dielectric layer has a dielectric constant less than 4.

15. The method of claim 14, wherein the oxygen-free organosilicon compound comprises diphenylmethylsilane, dimethylphenylsilane, or combinations thereof.

16. The method of claim 14, wherein the processing gas further includes an oxygen-containing organosilicon compound, an aliphatic hydrocarbon, or combinations thereof.

17. The method of claim 16, wherein the oxygen-containing organosilicon compound comprises dimethyldimethoxysilane.

18. The method of claim 16, wherein the aliphatic hydrocarbon selected from the group of ethylene, alcohol, and combinations thereof.

19. The method of claim 14, wherein the processing gas further comprises nitrogen.

20. The method of claim 14, wherein the processing gas further includes a dopant component selected from the group of a nitrogen-containing compound, a boron-containing compound, a phosphorus-containing compound, and combinations thereof.

21. The method of claim 20, wherein the nitrogen-containing compound is selected from the group of nitrogen gas, ammonia, a silazane, and combinations thereof.

22. The method of claim 14, wherein the dielectric layer is deposited prior to depositing the barrier layer, subsequent to the barrier layer, or both.

23. The method of claim 14, wherein the reacting the processing gas comprises generating a plasma by a high frequency RF power.

24. The method of claim 23, wherein the reacting the processing gas further comprises applying a low frequency RF power.

25. The method of claim 14, further comprising depositing a hardmask capping layer on the barrier layer.

26. The method of claim 14, wherein the e-beam curing technique comprises applying between about 500 and about 6,000 micro coulombs per square centimeter ($\mu c/cm^2$) at about 1 to 3 kiloelectron volts (KeV) to the barrier layer.

* * * * *